United States Patent
Yao

(10) Patent No.: US 9,786,699 B2
(45) Date of Patent: Oct. 10, 2017

(54) UV CLEANING DEVICE OF GLASS SUBSTRATE

(71) Applicant: Shenzhen China Star Optoelectronics Technology Co., Ltd., Shenzhen (CN)

(72) Inventor: Jiangbo Yao, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 209 days.

(21) Appl. No.: 14/771,208

(22) PCT Filed: Jul. 1, 2015

(86) PCT No.: PCT/CN2015/083067
§ 371 (c)(1),
(2) Date: Aug. 28, 2015

(87) PCT Pub. No.: WO2016/197426
PCT Pub. Date: Dec. 15, 2016

(65) Prior Publication Data
US 2016/0365371 A1 Dec. 15, 2016

(30) Foreign Application Priority Data
Jun. 12, 2015 (CN) .......................... 2015 1 0323940

(51) Int. Cl.
*H01L 21/67* (2006.01)
*H01L 27/12* (2006.01)
(Continued)

(52) U.S. Cl.
CPC ............ *H01L 27/1262* (2013.01); *B08B 5/00* (2013.01); *B08B 7/0057* (2013.01); *B08B 15/00* (2013.01);
(Continued)

(58) Field of Classification Search
CPC ................................................ H01L 21/67115
See application file for complete search history.

(56) References Cited

U.S. PATENT DOCUMENTS

| | | | | |
|---|---|---|---|---|
| 5,798,455 A | * | 8/1998 | Sakata | ..................... F24F 3/161 454/187 |
| 2007/0295355 A1 | * | 12/2007 | Ikuta | ................. H01L 21/67028 134/1 |

FOREIGN PATENT DOCUMENTS

CN 101131228 A 2/2008

* cited by examiner

*Primary Examiner* — Jason Ko
(74) *Attorney, Agent, or Firm* — Leong C. Lei

(57) ABSTRACT

The present invention provides an UV cleaning device of a glass substrate, comprising a lamp box, an UV lamp positioned above inside the lamp box, a transparent shield positioned under the UV lamp, a humidifier positioned under the transparent shield and a power exhaust device under the transparent shield and opposite to the humidifier; in usage, the glass substrate is conveyed to be inside the lamp box, and UV light generated by the UV lamp irradiates on the glass substrate through the shield to clean the glass substrate and a humidity and an oxygen content inside the lamp box are adjusted with the humidifier to make a surface of the glass substrate adsorb one layer of water molecules. The electrons generated as the UV light cleans can be gradually conducted and led out with water molecules to effectively restrain the accumulation of the electrostatic to reduce the phenomenon of electrostatic damage, and meanwhile, the increase of the oxygen content makes the concentration of the activated oxygen atoms increases along with. Accordingly, the result of cleaning the organic objects with the UV light is promoted.

7 Claims, 2 Drawing Sheets

(51) Int. Cl.
- *B08B 5/00* (2006.01)
- *B08B 7/00* (2006.01)
- *B08B 15/00* (2006.01)
- *H01L 21/02* (2006.01)
- *C03C 23/00* (2006.01)

(52) U.S. Cl.
CPC ........ *C03C 23/002* (2013.01); *C03C 23/0075* (2013.01); *H01L 21/02068* (2013.01); *H01L 21/02082* (2013.01); *H01L 21/6704* (2013.01); *H01L 21/67115* (2013.01)

UV CLEANING DEVICE OF GLASS SUBSTRATE

FIELD OF THE INVENTION

The present invention relates to a screen manufacture field, and more particularly to an UV cleaning device of a glass substrate.

BACKGROUND OF THE INVENTION

In the display skill field, Liquid Crystal Display (LCD), Organic Light Emitting Diode (OLED) and other panel display skills have been gradually replaced the CRT displays, and has been widely applied in LCDTV, mobile phone, personal digital assistant, digital camera, laptop screen or notebook screen.

The display panel is an important component of the LCD, OLED. Either in the display panel of the LCD or the display panel of the OLED, a Thin Film Transistor (TFT) array substrate is generally included. The display panel of the LCD is illustrated and mainly comprises a TFT array substrate, a Color Filter (CF) substrate and a Liquid Crystal Layer arranged between the two substrates. The working principle is that the light of backlight module is reflected to generate images by applying driving voltages to the TFT array substrate and the CF substrate for controlling the rotations of the liquid crystal molecules.

At present, in the manufacture process of the TFT elements, the EUV cleaning device of wavelength 172 nm is utilized for cleaning the surface of the glass substrate to obtain an excellent clean result. However, the issue of the electrostatic damage to the TFT elements in large area caused by the Electro-Static discharge (ESD) is brought along with. Particularly, with the resolution of the production gets higher and higher, and the line width of the electrodes gets smaller and smaller, the ability of suffering the Electro-Static discharge becomes smaller and the electrostatic damage happens more easily.

As shown in FIG. 1, it is a picture of electrostatic damage after an UV cleaning device according to prior art is utilized to clean a TFT substrate, of which the gate electrode process is accomplished before the isolation layer film formation.

When the reason of electrostatic generation, it is found that the high energy photons emitted from the UV light excite the electrons of the metal electrode to escape. The electrons are accumulated on the insulative glass surface and cannot be slowly led out. When the accumulated amount exceeds the tolerance range of the metal electrode, it will cause the electrostatic damage to the TFT circuit elements.

SUMMARY OF THE INVENTION

An objective of the present invention is to provide an UV cleaning device of a glass substrate, capable of reducing the electrostatic damage caused by UV cleaning, and increasing an active oxygen content inside the UV lamp box to promote the result of the UV light cleaning.

For realizing the aforesaid objective, the present invention provides an UV cleaning device of a glass substrate, comprising a lamp box, an UV lamp positioned above inside the lamp box, a transparent shield positioned under the UV lamp, a humidifier positioned under the transparent shield and a power exhaust device under the transparent shield and opposite to the humidifier;

in usage, the glass substrate is conveyed to be inside the lamp box, and UV light generated by the UV lamp irradiates on the glass substrate through the shield to clean the glass substrate and a humidity and an oxygen content inside the lamp box are adjusted with the humidifier.

A wavelength of the UV light irradiated by the UV lamp is 172 nm.

A transparent hydrophobic coating is overlaid on one side of the glass substrate close to the shield.

The humidifier is positioned above the glass substrate parallel with a conveying direction of the glass substrate.

An airflow direction of the humidifier is parallel with and close to a surface of the glass substrate.

The humidifier respectively exports water vapor, oxygen, nitride to adjust the humidity and the oxygen content inside the lamp box.

The UV cleaning device of the glass substrate further comprises a tester for testing the air humidity and the oxygen content inside the lamp box, and the tester is positioned near the humidifier.

An exhaust flow of the power exhaust device is adjustable.

In usage, the humidity and the oxygen content inside the lamp box are adjusted according to an electrostatic resistance of the glass substrate.

The present invention further provides an UV cleaning device of a glass substrate, comprising a lamp box, an UV lamp positioned above inside the lamp box, a transparent shield positioned under the UV lamp, a humidifier positioned under the transparent shield and a power exhaust device under the transparent shield and opposite to the humidifier;

in usage, the glass substrate is conveyed to be inside the lamp box, and UV light generated by the UV lamp irradiates on the glass substrate through the shield to clean the glass substrate and a humidity and an oxygen content inside the lamp box are adjusted with the humidifier;

wherein a wavelength of the UV light irradiated by the UV lamp is 172 nm;

wherein a transparent hydrophobic coating is overlaid on one side of the glass substrate close to the shield;

the UV cleaning device of the glass substrate further comprises a tester for testing the air humidity and the oxygen content inside the lamp box, and the tester is positioned near the humidifier.

The benefits of the present invention are: in the UV cleaning device of the glass substrate according to the present invention, a humidifier and a power exhaust device are added in the UV cleaning device, and in usage, the humidity and the oxygen content inside the lamp box can be freely adjusted by controlling the humidifier and the power exhaust device to make a surface of the glass substrate adsorb one layer of water molecules. The electrons generated as the UV light cleans can be gradually conducted and led out with water molecules to effectively restrain the accumulation of the electrostatic to reduce the phenomenon of electrostatic damage, and meanwhile, the increase of the oxygen content makes the concentration of the activated oxygen atoms increases along with. Accordingly, the result of cleaning the organic objects with the UV light is promoted.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 1:
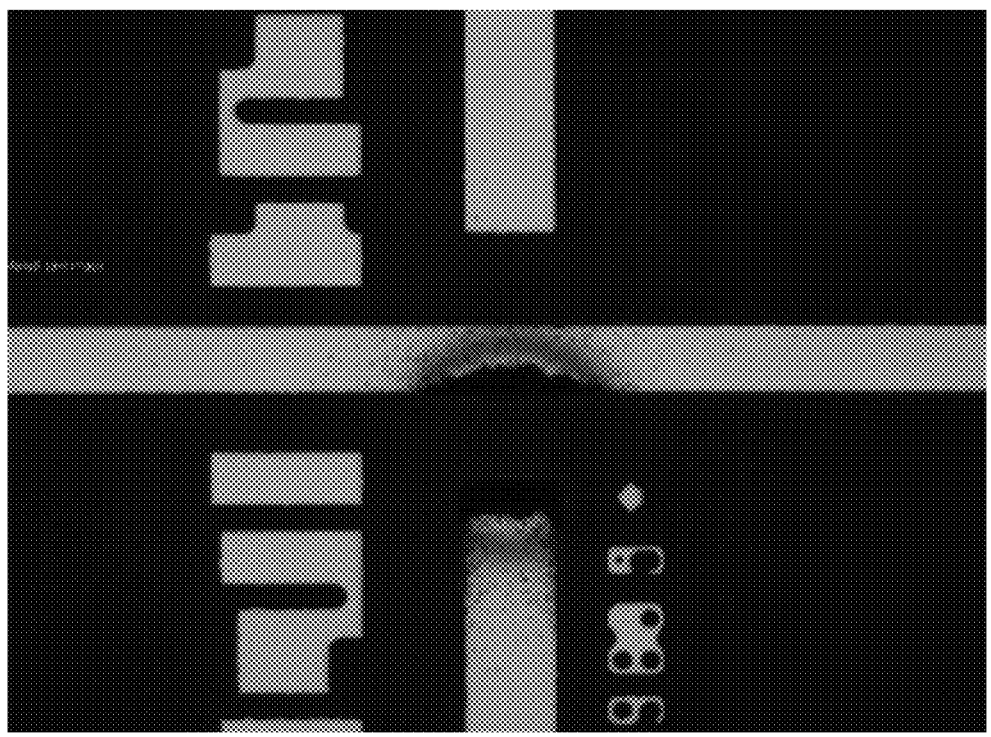
FIG. 1 is a picture of electrostatic damage after an UV cleaning device according to prior art is utilized to clean a TFT substrate.
Figure 2:
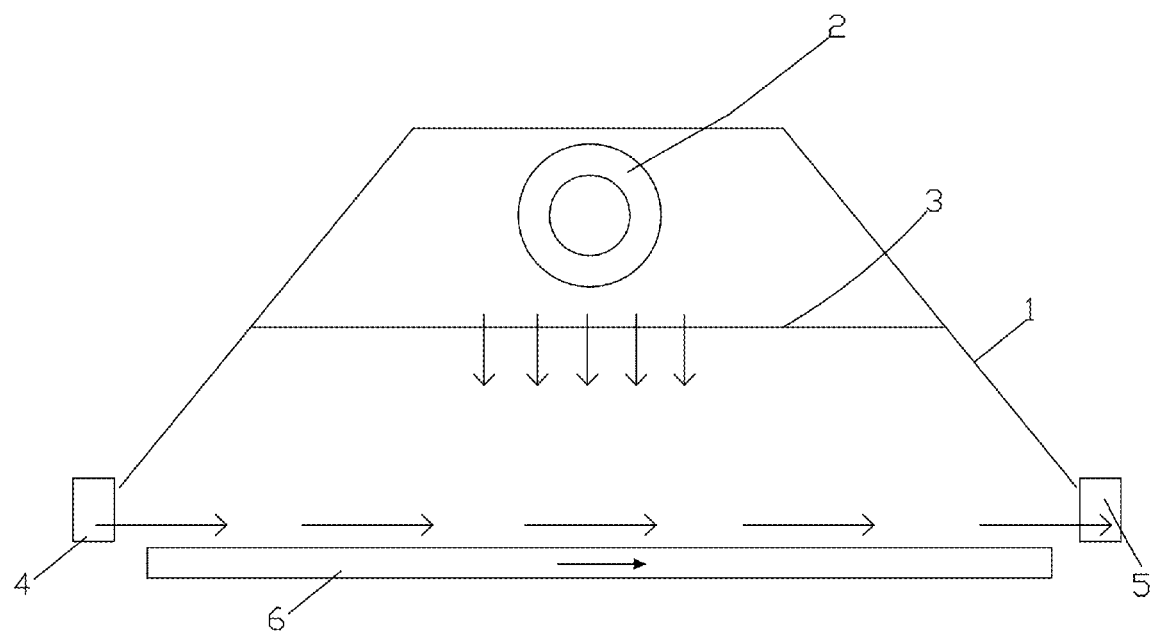
FIG. 2 is a structural diagram of an UV cleaning device of a glass substrate according to the present invention.

Please refer to FIG. 2. The present invention provides an UV light cleaning device of a glass substrate, comprising a lamp box 1, an Excimer UV lamp 2 positioned above inside the lamp box 1, which is capable of irradiating UV light of wavelength 172 nm, a transparent shield 3 positioned under the UV lamp 2, a humidifier 4 positioned under the transparent shield 3 and a power exhaust device 5 under the transparent shield 3 and opposite to the humidifier 4, which is employed for ensuring the air circulation inside the lamp box 1 and the exhaust flow is adjustable;

in usage, the glass substrate 6 is conveyed to be inside the lamp box 1, and UV light generated by the UV lamp 2 irradiates on the glass substrate 6 through the shield 3 to clean the glass substrate 6 and a humidity and an oxygen content inside the lamp box 1 are adjusted with the humidifier 4.

Specifically, the shield 3 is employed to prevent the impure gas to adhere on the UV lamp 2 after cleaning to affect the usage lifetime and the irradiation effect; a transparent hydrophobic coating is overlaid on one side of the shield 3 close to the glass substrate 6 and employed to prevent the atomization of the shield 3 due to the temperature change.

Specifically, the humidifier 4 is positioned above the glass substrate 6 parallel with a conveying direction of the glass substrate 6 to ensure that the gas deliver distance is shorter. An airflow direction of the humidifier 4 is parallel with and close to a surface of the glass substrate 6 for ensuring that the water molecules can fully adhere on the glass substrate 6 and do not diffuse on the shield 3 of the UV lamp 2 as less as possible to prevent the formation of water spray which influence the cleaning result of the UV light.

Specifically, the humidifier 4 respectively exports water vapor, oxygen, nitride to adjust the humidity and the oxygen content inside the lamp box 1; wherein an object in the wet air environment will adsorb water molecules on the surface of the object, and these water molecules will result in that the surface electron conductibility of the media object increases to enforce the leakage ability of the electrostatic charges, which effectively restrain the accumulation happening of the electrostatic charges. Besides, oxygen will produce active oxygen atom groups in high energy UV light, and the active oxygen atoms will react with organic molecules of which the molecular chain will be broken by the UV light. The higher the concentration of the active oxygen atom is, the more thorough the reaction with the organics is to effectively promote the clean result. Therefore, to adjust the humidity inside the lamp box 1, the phenomenon of electrostatic damage can be effectively prevented, and to increase the oxygen content inside the lamp box 1, the cleaning result of the cleaning device can be promoted.

Specifically, a tester (not shown) is further provided near the humidifier 4 for testing the air humidity and the oxygen content inside the lamp box 1. It can monitor the humidity and the oxygen content inside the lamp box 1 in real time and upload the information to the main controller (not shown) of the UV light cleaning device.

As the UV light cleaning device is employed to clean, the humidity and the oxygen content inside the lamp box 1 are adjusted by controlling the humidifier 4 and the power exhaust device 5 according to an electrostatic resistance of the glass substrate 6.

In conclusion, in the UV cleaning device of the glass substrate provided by the present invention, a humidifier and a power exhaust device are added in the UV cleaning device, and in usage, the humidity and the oxygen content inside the lamp box can be freely adjusted by controlling the humidifier and the power exhaust device to make a surface of the glass substrate adsorb one layer of water molecules. The electrons generated as the UV light cleans can be gradually conducted and led out with water molecules to effectively restrain the accumulation of the electrostatic to reduce the phenomenon of electrostatic damage, and meanwhile, the increase of the oxygen content makes the concentration of the activated oxygen atoms increases along with. Accordingly, the result of cleaning the organic objects with the UV light is promoted.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An UV cleaning device of a glass substrate, comprising a lamp box, an UV lamp positioned above inside the lamp box, a transparent shield positioned under the UV lamp, a humidifier positioned under the transparent shield and a power exhaust device under the transparent shield and opposite to the humidifier;

in usage, the glass substrate is conveyed to be inside the lamp box, and UV light generated by the UV lamp irradiates on the glass substrate through the shield to clean the glass substrate and a humidity and an oxygen content inside the lamp box are adjusted with the humidifier;

wherein the humidifier and the power exhaust device are respectively positioned above two sides of the glass substrate parallel with a conveying direction of the glass substrate; an airflow direction of the humidifier is parallel with and close to a surface of the glass substrate;

wherein a transparent hydrophobic coating is overlaid on one side of the shield close to the glass substrate;

wherein the humidifier respectively exports water vapor, oxygen, nitride to adjust the humidity and the oxygen content inside the lamp box;

wherein the UV cleaning device further comprises a tester for testing the air humidity and the oxygen content inside the lamp box, and the tester is positioned near the humidifier.

2. The UV cleaning device of the glass substrate according to claim 1, wherein a wavelength of the UV light irradiated by the UV lamp is 172 nm.

3. The UV cleaning device of the glass substrate according to claim 1, wherein an exhaust flow of the power exhaust device is adjustable.

4. The UV cleaning device of the glass substrate according to claim 1, wherein in usage, the humidity and the oxygen content inside the lamp box are adjusted according to an electrostatic resistance of the glass substrate.

5. An UV cleaning device of a glass substrate, comprising a lamp box, an UV lamp positioned above inside the lamp box, a transparent shield positioned under the UV lamp, a humidifier positioned under the transparent shield and a power exhaust device under the transparent shield and opposite to the humidifier;

in usage, the glass substrate is conveyed to be inside the lamp box, and UV light generated by the UV lamp irradiates on the glass substrate through the shield to clean the glass substrate and a humidity and an oxygen content inside the lamp box are adjusted with the humidifier;

wherein the humidifier and the power exhaust device are respectively positioned above two sides of the glass substrate parallel with a conveying direction of the glass substrate; an airflow direction of the humidifier is parallel with and close to a surface of the glass substrate;

wherein a wavelength of the UV light irradiated by the UV lamp is 172 nm;

wherein, a transparent hydrophobic coating is overlaid on one side of the shield close to the glass substrate;

wherein the humidifier respectively exports water vapor, oxygen, nitride to adjust the humidity and the oxygen content inside the lamp box;

wherein, the UV cleaning device of the glass substrate further comprises a tester for testing the air humidity and the oxygen content inside the lamp box, and the tester is positioned near the humidifier.

6. The UV cleaning device of the glass substrate according to claim 5, wherein an exhaust flow of the power exhaust device is adjustable.

7. The UV cleaning device of the glass substrate according to claim 5, wherein in usage, the humidity and the oxygen content inside the lamp box are adjusted according to an electrostatic resistance of the glass substrate.

* * * * *